(12) United States Patent
Long et al.

(10) Patent No.: US 8,107,227 B2
(45) Date of Patent: Jan. 31, 2012

(54) COVER MECHANISM AND ELECTRONIC DEVICE USING SAME

(75) Inventors: Jiang Long, Shenzhen (CN); Ping-Kun Fu, Taipei (TW); Bin Xiong, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 314 days.

(21) Appl. No.: 12/610,516

(22) Filed: Nov. 2, 2009

(65) Prior Publication Data
US 2011/0032664 A1   Feb. 10, 2011

(30) Foreign Application Priority Data
Aug. 4, 2009   (CN) .......................... 2009 1 0305143

(51) Int. Cl.
*G06F 1/16* (2006.01)

(52) U.S. Cl. ...................... 361/679.01; 292/57; 455/90.3

(58) Field of Classification Search ............. 361/679.01; 455/90.3, 575.3; 312/223.1; 292/57
See application file for complete search history.

(56) References Cited

U.S. PATENT DOCUMENTS

| | | | | |
|---|---|---|---|---|
| 6,135,582 | A * | 10/2000 | Schuelke et al. | 312/223.1 |
| 7,611,371 | B2 * | 11/2009 | Guo | 439/367 |
| 7,800,891 | B2 * | 9/2010 | Shi et al. | 361/679.01 |
| 2009/0270144 | A1 * | 10/2009 | Yang et al. | 455/575.3 |
| 2009/0270145 | A1 * | 10/2009 | Yang et al. | 455/575.3 |
| 2009/0314044 | A1 * | 12/2009 | Yang et al. | 70/158 |
| 2009/0322191 | A1 * | 12/2009 | Chang et al. | 312/223.1 |
| 2010/0119924 | A1 * | 5/2010 | Wang et al. | 429/98 |
| 2010/0128420 | A1 * | 5/2010 | Li et al. | 361/679.01 |
| 2010/0264671 | A1 * | 10/2010 | Zuo | 292/57 |
| 2010/0309613 | A1 * | 12/2010 | Zuo et al. | 361/679.01 |

* cited by examiner

*Primary Examiner* — Lisa Lea Edmonds
(74) *Attorney, Agent, or Firm* — Altis Law Group, Inc.

(57) ABSTRACT

A cover mechanism for an electronic device includes a protective cover and a resisting member. The protective cover includes a cover portion, and an arm portion. The arm portion allows the protective cover to rotate relative to the electronic device. The resisting member is attached to the electronic device, and prevents the arm portion from separating from the electronic device.

14 Claims, 4 Drawing Sheets

COVER MECHANISM AND ELECTRONIC DEVICE USING SAME

BACKGROUND

1. Technical Field

The present disclosure relates to cover mechanisms used in electronic devices (e.g., mobile phones).

2. Description of Related Art

Electronic devices usually have external interfaces (e.g., universal serial bus (USB)) for electrically connecting external devices (e.g., printers), accessories (e.g., USB flash drives) or other electronic devices. Such external interfaces are usually protected by cover mechanisms from e.g., dust or water, to maintain proper functioning.

The cover mechanisms usually include covers with locks. The covers are typically locked to the electronic devices by latches to cover the area through which the interfaces of electronic devices are exposed. However, the covers are often not permanently attached to the electronic device. Thus, the covers may easily be misplaced or lost when not locked to the electronic devices.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the present cover mechanism. Moreover, in the drawings, like reference numerals designate corresponding parts throughout the several views, in which.

DETAILED DESCRIPTION

Figure 1:
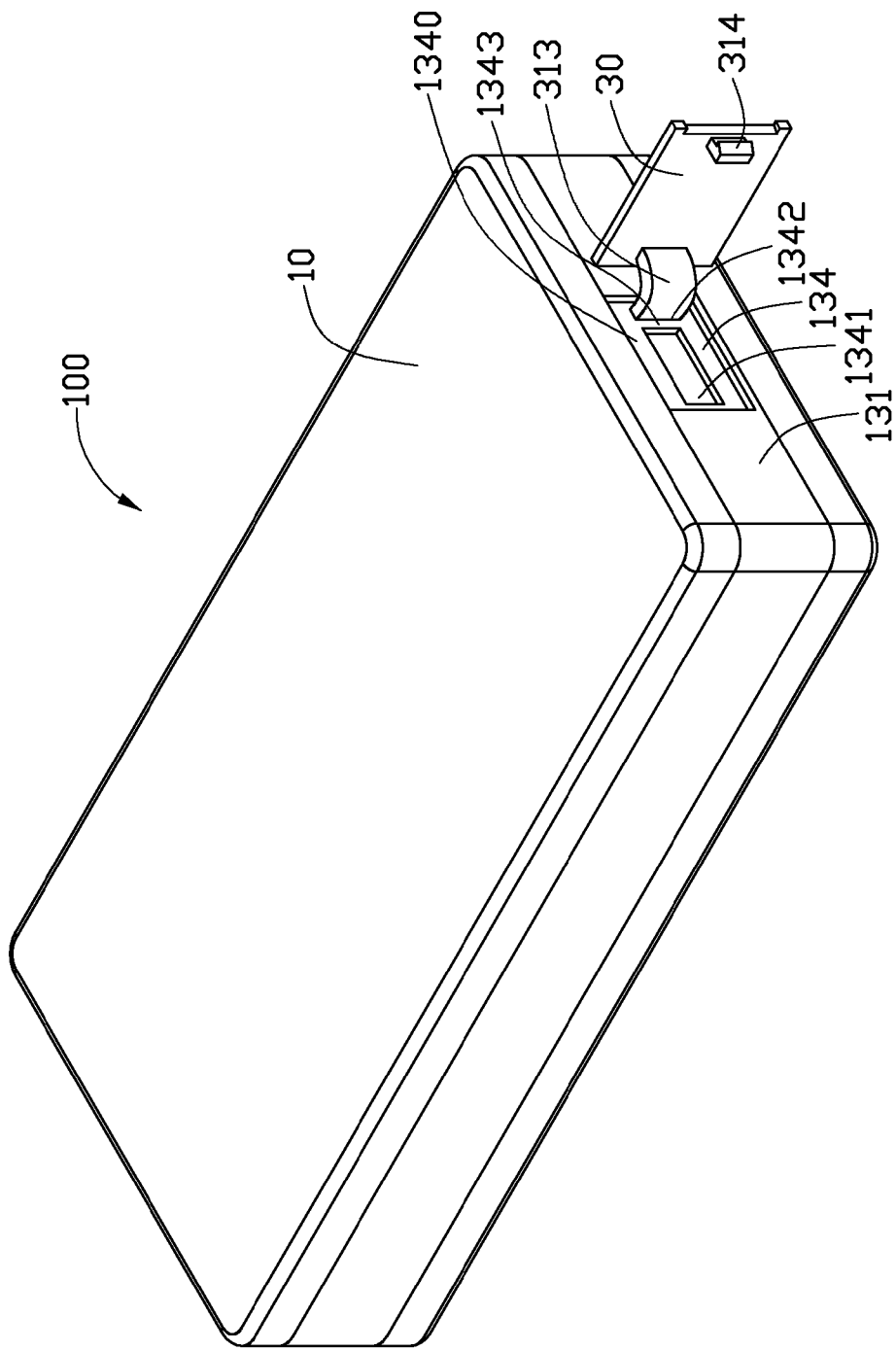
FIG. 1 is an assembled, isometric view of an exemplary cover mechanism showing it in an opened position.
Figure 2:
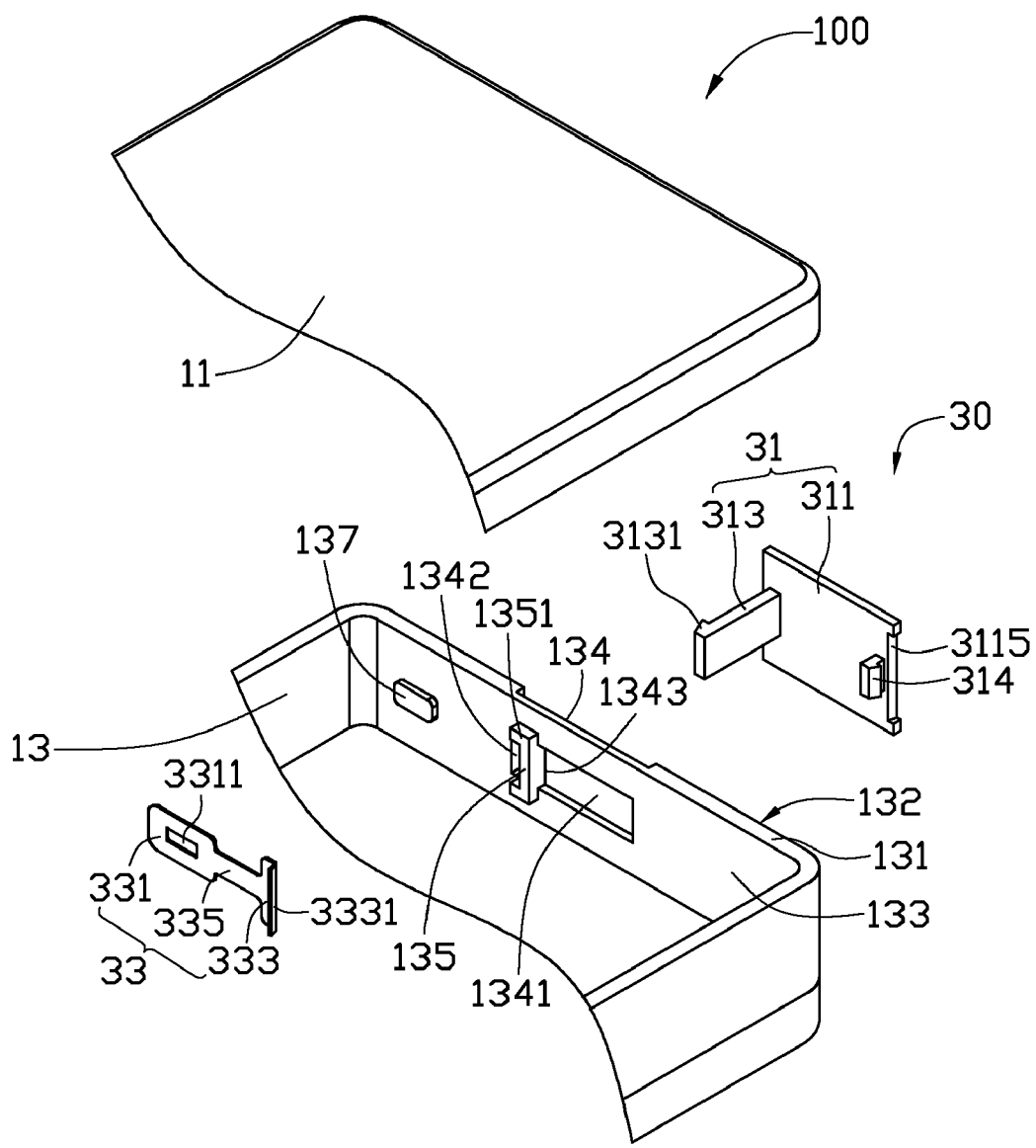
FIG. 2 is an exploded, isometric view of an exemplary cover mechanism used in an electronic device.

FIG. 1 shows an exemplary embodiment of a cover mechanism 30 used with an electronic device 100, such as a mobile phone.

The mobile phone 100 includes a cover member 11, and a main body 13. The cover member 11 is detachably attached to one side of the main body 13. The main body 13 includes at least one wall 131 communicating with an inside of the mobile phone 100. The wall 131 includes an outer surface 132 and an inner surface 133. The outer surface 132 defines a rectangular recess 134 with a recess wall 1340. The recess wall 1340 defines an opening 1341 and a latching slot 1342. In this embodiment, the opening 1341 is a connector interface hole. The opening 1341 is spaced from the latching slot 1342 by a beam 1343. A protrusion 135 is formed on the beam 1343 of the inner surface 133. The protrusion 135 can be substantially [-shaped, and includes two extending ends 1351. The extending ends 1351 are positioned at two ends of the latching slot 1342 on inner surface 133. A block 137 is formed on the inner surface 133, adjacent to the protrusion 135.

The cover mechanism 30 includes a protective cover 31 and a resisting member 33. The protective cover 31 includes a cover portion 311. The cover portion 311 defines a notch 3115 at one end thereof for conveniently operating the cover portion 311. An arm portion 313 is formed at an end of the cover portion 311 spaced from the notch 3115. The arm portion 33 is for being received in the latching slot 1342 and made of flexible and elastic material such as rubber and soft plastics. When the arm portion 313 is attached to the mobile phone 100, the arm portion 313 may deform, allowing the cover portion 311 to rotate relative to the wall 131. The arm portion 313 forms a clamping end 3131 at a distal end thereof. A latching portion 314 is formed at the other end of the cover portion 311 for detachably locking to an inside of the wall 131. The resisting member 33 can be substantially a metal sheet, including a fixing portion 331, a connecting portion 335 and a resisting portion 333 integrally formed together. The fixing portion 331 defines a cutout 3311 for receiving the block 137 with an interfering lock fit. The connecting portion 335 has a smaller width than the fixing portion 331 and the resisting portion 333. The resisting portion 333 includes an angled end 3331. When the resisting member 33 is attached to the inner surface 133 of the wall 131, the angled end 3331 resists the extending ends 1351 of the protrusion 135. The clamping end 3131 is engaged with the angled end 331 so as to allow the arm portion 313 to be attached to the wall 131.

Figure 3:
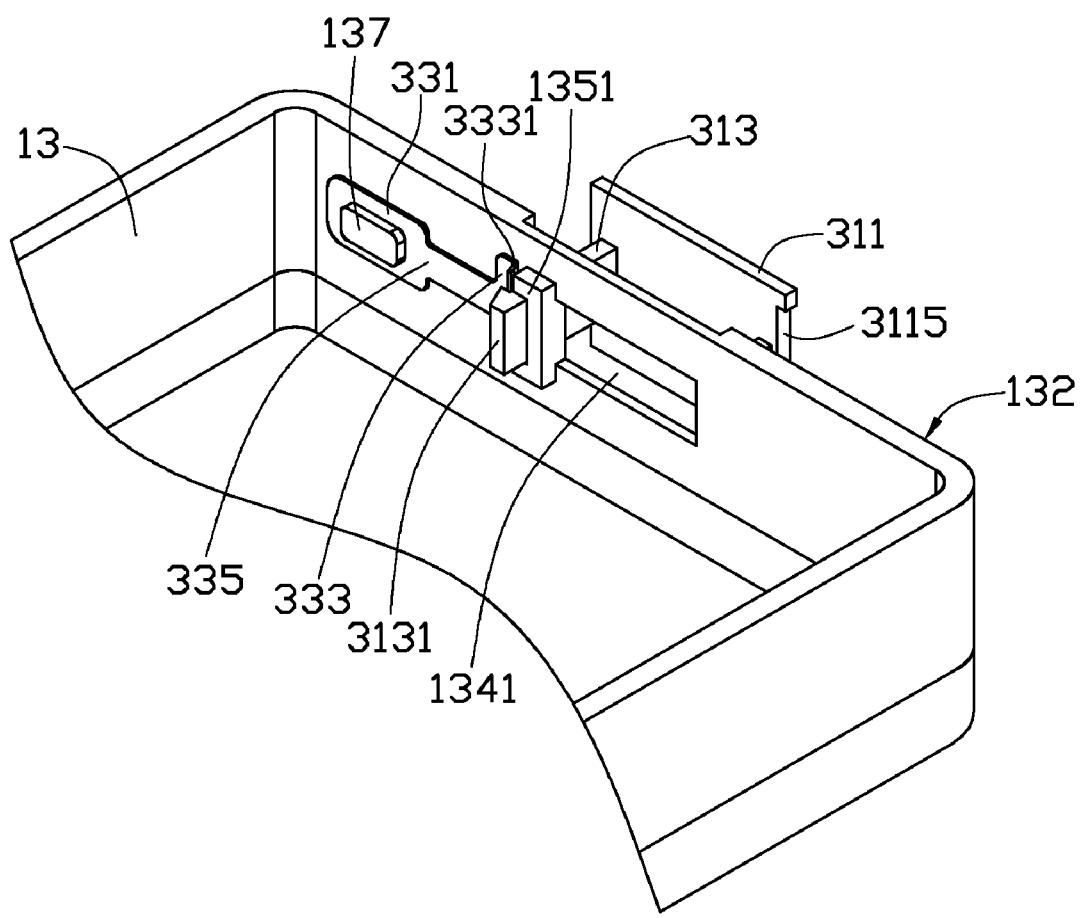
FIG. 3 is a partially assembled, isometric view of the cover mechanism shown in FIG. 1.
Figure 4:
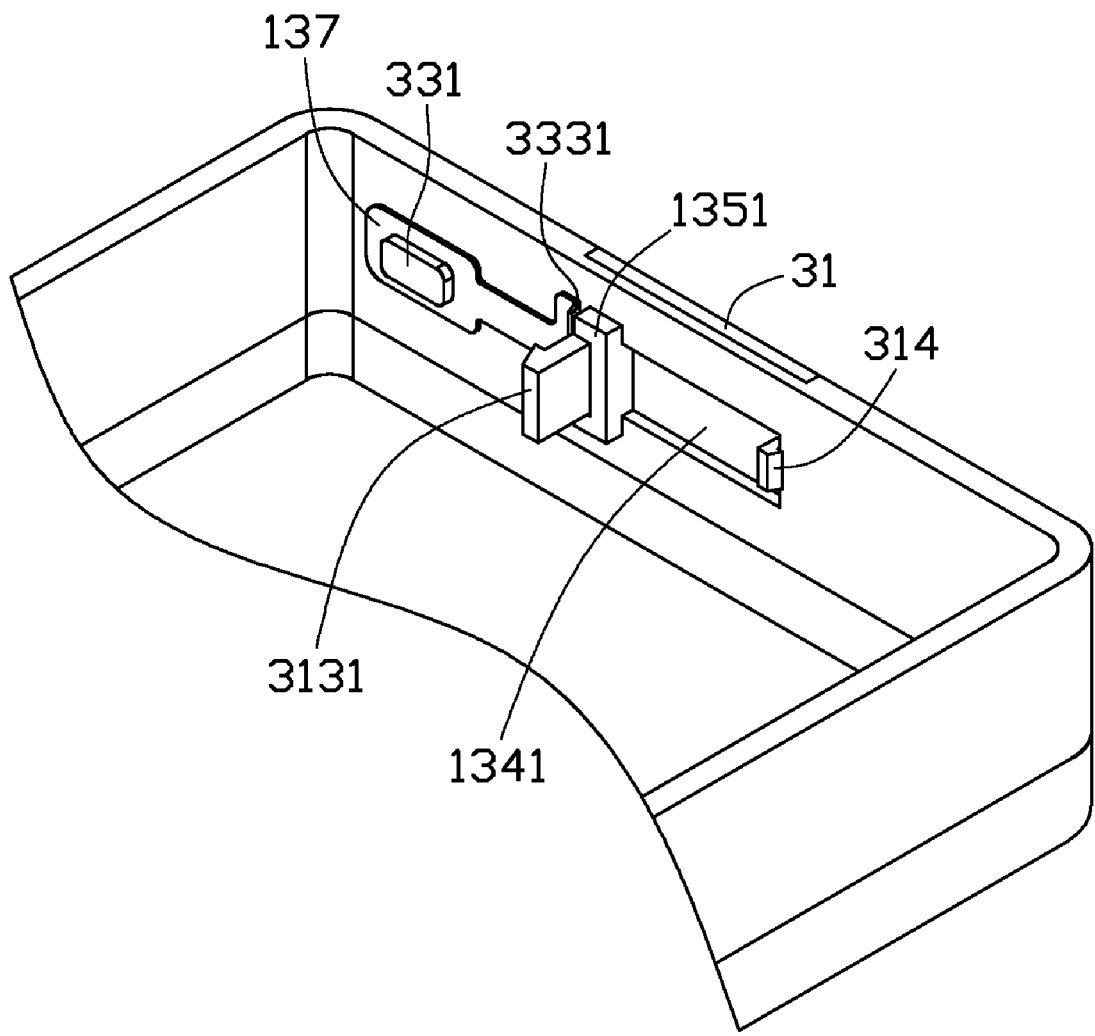
FIG. 4 is an assembled, isometric view of the exemplary cover mechanism shown in FIG. 2.

In FIGS. 3 and 4, when the cover mechanism 30 being assembled to the main body 13, the resisting member 33 is positioned at the inside of the wall 131. The block 137 is received in the cutout 3311, and the angled end 3331 abuts the extending ends 1351 of the protrusion 135. The arm portion 313 of the protective cover 31 deformedly passes through the latching slot 1342, and pushes the angled end 3331. The resisting member 33 is bent away from the wall 131 to allow the clamping end 3131 to pass over the angled end 3331, after which the angled end 3331 returns to its normal position. The arm portion 313 further slides further inward until the cover portion 311 completely covers the recess 134. At the same time, the latching portion 314 extends into the opening 1341, and latches on the wall 131. Thus, the cover mechanism 30 is completely assembled to the mobile phone 100.

When the protective cover 31 is to be opened, the operator may grip the cover portion 311 using the notch 3115 to rotate the protective cover 31 so that the latching portion 314 separates from the opening 1341. At the same time, the arm portion 333 slides through the latching slot 1342 until the clamping end 3131 latches with the angled end 3331 of the resisting member 33. The angled end 331 prevents the arm portion 313 from completely sliding through latching slot 1342 and separating from the electronic device 10 separating. After that, since the arm portion 313 is deformable, the cover portion 311 may be rotated about the latching slot 1342. Therefore, the opening 1341 is exposed from the wall 131 for insertion of one of various kinds of plugs.

To close and lock the cover mechanism 30, the above process is reversed and the protective cover 31 moved from the opened position to the closed position. The closing process ends when the latching portion 314 latches the wall 131.

It is understood that the cover portion 312 is connected with the fixed portion 311 at a suitable angle at an original state. In addition, only the connecting portion 312 of the protective cover 31 is made of elastic material for allowing the cover portion 312 to be bent relative to the fixed portion 311.

It is to be understood, however, that even through numerous characteristics and advantages of the exemplary invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cover mechanism for an electronic device, the cover mechanism comprising:
   a main body including a wall, the wall defining a latching slot and an opening spaced from the latching slot by a beam;
   a protective cover latched to the latching slot of the main body, the protective cover including a cover portion, and a deformable arm portion; the arm portion allowing the protective cover to slide and rotate relative to the main body;
   a resisting member attached to the wall of the main body, and preventing the arm portion from separating from the main body.

2. The cover mechanism as claimed in claim 1, wherein a latching portion is formed at an end of the cover portion opposite to the arm portion.

3. The cover mechanism as claimed in claim 2, wherein the arm portion is made of flexible and elastic material.

4. The cover mechanism as claimed in claim 1, wherein the wall a recess, the arm portion is latched to the main body by being received in the latching slot.

5. The cover mechanism as claimed in claim 4, wherein a protrusion is formed on an inside surface of the beam.

6. The cover mechanism as claimed in claim 5, wherein the protrusion is substantially [-shaped, and includes two extending ends.

7. The cover mechanism as claimed in claim 1, wherein an inner surface of the wall forms a block, the resisting member defines a cutout, and the block is received in the cutout with an interference lock fit.

8. The cover mechanism as claimed in claim 7, wherein the resisting member includes an angled end, the arm portion includes a clamping end, and the clamping end is for latching with the angled end.

9. A cover mechanism for covering a hole of an electronic device, the cover mechanism comprising:
   a protective cover including a cover portion, an arm portion and a latching portion integrally formed together, the arm portion and the latching portion formed at two sides of the cover portion, the arm portion allowing the cover portion to be elastically bent relative to the electronic device to a position covering the hole; and
   a resisting member defining a cutout;
   wherein a block is formed on the electronic device, and the block is received in the cutout with an interference lock fit.

10. The cover mechanism as claimed in claim 9, wherein the resisting member includes an angled end, the arm portion includes a clamping end, and the clamping end is for latching with the angled end.

11. An electronic device, comprising:
    a housing including a wall defining a hole;
    a cover mechanism, comprising:
       a resisting member attached to an inner surface of the wall;
       a protective cover latched to an outer surface of the wall for movement between:
          a closed position, where the protective cover is moved to a position covering the hole, and the protective cover is disengaged from the resisting member; and
          an open position, where one portion of the protective cover can be deformed to expose the hole while another portion of the protective cover engages with the resisting member and remains attached to the wall.

12. The electronic device as claimed in claim 10, wherein the protective cover includes a cover portion, an arm portion and a latching portion integrally formed together, the arm portion and the latching portion formed at two sides of the cover portion.

13. The electronic device as claimed in claim 12, wherein the resisting member defines a cutout, the electronic device forms a block, and the block is received in the cutout with an interference lock fit.

14. The electronic device as claimed in claim 13, wherein the resisting member includes an angled end, the arm portion includes a clamping end, the clamping end for latching with the angled end.

* * * * *